United States Patent
Yamamuro

(10) Patent No.: US 9,035,339 B2
(45) Date of Patent: May 19, 2015

(54) LIGHT EMITTING DEVICE AND METHOD

(71) Applicant: Stanley Electric Co., Ltd., Tokyo (JP)

(72) Inventor: Tomofumi Yamamuro, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 13/776,682

(22) Filed: Feb. 25, 2013

(65) Prior Publication Data

US 2013/0221389 A1    Aug. 29, 2013

(30) Foreign Application Priority Data

Feb. 24, 2012    (JP) .................. 2012-038218

(51) Int. Cl.
*H01L 33/10*    (2010.01)
*H01L 33/50*    (2010.01)
*H01L 33/58*    (2010.01)

(52) U.S. Cl.
CPC ............. *H01L 33/10* (2013.01); *H01L 33/50* (2013.01); *H01L 33/58* (2013.01); *H01L 2933/0091* (2013.01); *H01L 2924/0002* (2013.01); *H01L 2224/13* (2013.01)

(58) Field of Classification Search
CPC ........................................ H01L 33/10
See application file for complete search history.

(56) References Cited

U.S. PATENT DOCUMENTS 7,889,421 B2 *    2/2011    Narendran et al. ........... 359/326
2006/0034084 A1 *    2/2006    Matsuura et al. ............. 362/293

FOREIGN PATENT DOCUMENTS

JP    2010-219324 A    9/2010

* cited by examiner

*Primary Examiner* — Lex Malsawma
(74) *Attorney, Agent, or Firm* — Kenealy Vaidya LLP

(57) ABSTRACT

A light emitting device and a method of manufacturing the same are capable of enhancing brightness and color distribution characteristics on a light-exiting surface. The light emitting device can include: a substrate; a light emitting stacked body composed of a semiconductor light emitting element disposed on the substrate, a wavelength conversion layer disposed on the semiconductor light emitting element and containing phosphor particles, and a light-transmitting plate member disposed on the wavelength conversion layer; and a light-transmitting scattering member containing a scattering material and disposed on the light-transmitting plate member.

22 Claims, 4 Drawing Sheets

Fig. 7
|  | Example 1 | Comparative Example 4 | Comparative Example 5 |
|---|---|---|---|
| Non-uniformity in Brightness | A | C | B |
| Non-uniformity in Color | A | C | B |
| Color Separation | A | C | B |
Fig. 8
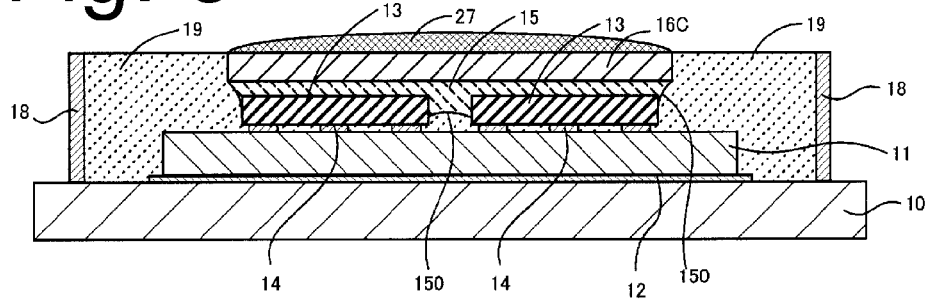
Fig. 9
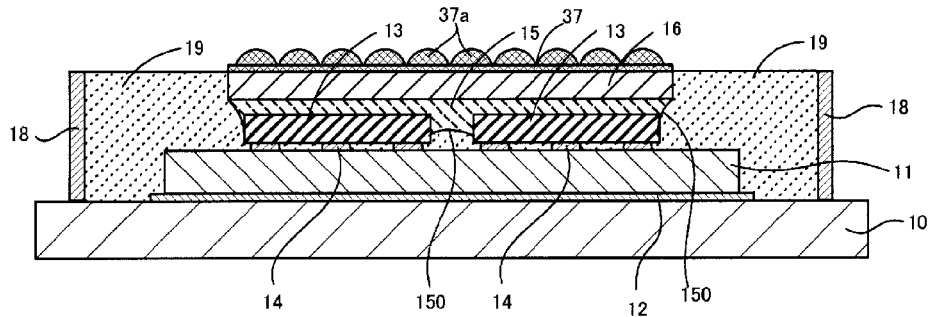

LIGHT EMITTING DEVICE AND METHOD

This application claims the priority benefit under 35 U.S.C. §119 of Japanese Patent Application No. 2012-038218 filed on Feb. 24, 2012 which is hereby incorporated in its entirety by reference.

TECHNICAL FIELD

The presently disclosed subject matter relates to a light emitting device having a light emitting element and a method of manufacturing the light emitting device.

BACKGROUND ART

In a known light emitting device, a wavelength conversion layer composed of a resin layer containing phosphor particles can be formed on a light emitting element such as a light emitting diode. Part of light from the light emitting element can be converted by the phosphor particles in the wavelength conversion layer to light with a different wavelength, and the light converted by the phosphor particles can be mixed with light received directly from the light emitting element after passing through the wavelength conversion layer. Then resultant light with mixed color can be emitted from the light emitting device.

In this light emitting device, a light-transmitting plate member to allow the light mixed in the wavelength conversion layer to pass therethrough can be disposed on the wavelength conversion layer (see Japanese Patent Application Laid-Open No. 2010-219324, for example). Further, this light emitting device is configured to extract light emitted from the light emitting element to the outside of the light emitting device by covering, with a reflective member made of a material such as a reflective resin, each side surface of the light emitting element, the wavelength conversion layer, and the light-transmitting plate member.

In the conventional light emitting device, the light-transmitting plate member is larger than the light emitting element. This generates problems such as non-uniformities in brightness and color and color separation between a part directly above the center of a light-exiting main surface of the light emitting element and a region around this part, making it difficult or impossible to obtain uniform brightness and color distribution characteristics on a light-exiting surface of the light emitting device.

The non-uniformities in brightness and color and the like may be suppressed by forming a surface of the light-transmitting plate member as a concave-convex surface. However, this can generates problems such as a rising up of the reflective member disposed on the periphery of the light-transmitting plate member through an edge surface of the light-transmitting plate member. Thus, a peripheral region of the light-transmitting plate member may be formed as a region without concave-convex surface to prevent rising up of the reflective member. However, this in turn generates a problem in that the non-uniformities in brightness and color are left unremoved in the peripheral region.

SUMMARY

The presently disclosed subject matter was devised in view of these and other problems and features in association with the conventional art. According to an aspect of the presently disclosed subject matter, there are provided a light emitting device and a method of manufacturing the same capable of enhancing brightness and color distribution characteristics on a light-exiting surface.

According to another aspect of the presently disclosed subject matter, a light emitting device can include: a substrate; a light emitting stacked body composed of a semiconductor light emitting element disposed on the substrate, a wavelength conversion layer disposed on the semiconductor light emitting element and containing phosphor particles, and a light-transmitting plate member disposed on the wavelength conversion layer; and a light-transmitting scattering member containing a scattering material and disposed on the light-transmitting plate member.

In the above-mentioned light emitting device with that configuration, the scattering material can have a photocatalitic function, the wavelength conversion layer can include a base material composed of a resin, and the light transmitting plate member and the light-transmitting scattering member can be composed of respective inorganic materials. In this case, the base material of the wavelength conversion layer can be a silicone resin, the light transmitting plate member can be composed of glass, and the light-transmitting scattering member can include a base material composed of glass.

The above-mentioned light emitting device with that configuration can be configured to further include a reflective member provided to cover a side portion of the light emitting stacked body. In this case, the reflective member can include a base material composed of a resin, and the light-transmitting scattering member can be disposed to project from a surface level of the reflective member so as not be in contact with the reflective member.

According to still another aspect of the presently disclosed subject matter, a method of manufacturing a light emitting device can include: a first step of disposing an uncured resin containing phosphor particles dispersed therein on a semiconductor light emitting element placed on a substrate; a second step of placing a light-transmitting plate member above the light emitting element through the uncured resin, the light-transmitting plate member having an upper surface on which a light-transmitting scattering member is formed; a third step of curing the uncured resin to form a wavelength conversion layer between the light emitting element and the light-transmitting plate member; a fourth step of disposing a frame on the substrate so as to surround the light emitting element; and a fifth step of filing a space between the light emitting element and the frame with a reflective member, wherein the light-transmitting scattering member can contain a scattering material, and can have an upper surface given flatness to prevent the reflective member from rising up onto the upper surface due to capillary action. Although the above method features are described as steps, the timing of each step can be in other and different orders, such as simultaneous, non-sequential, sequential, differing orders, etc.

According to the light emitting device and the method of manufacturing the same as described above, the light-transmitting scattering member containing the scattering material can be disposed on the light-transmitting plate member in the light emitting stacked body. Thus, light to exit the light emitting device can be given scattering effect, so that uniform brightness and color distribution characteristics can be obtained on an entire light-exiting surface. As a result, non-uniformities in brightness and color, and color separation can be corrected on the light-exiting surface of the light emitting device. Further, the light-transmitting scattering member can be configured to be distanced away from the wavelength conversion layer. Thus, the resin used in the wavelength conversion layer becomes less likely to be decomposed by photocatalytic action of the scattering material in the light-transmitting scattering member. Further, in the method of manufacturing the light emitting, the upper surface of the light-transmitting scattering member is flattened to prevent generation of capillary action. This prevents the reflective member from rising up onto the upper surface of the light-transmitting scattering member. As a result, non-uniformities in brightness and color are suppressed in a peripheral region of the light-transmitting plate member.

BRIEF DESCRIPTION OF DRAWINGS

These and other characteristics, features, and advantages of the presently disclosed subject matter will become clear from the following description with reference to the accompanying drawings, wherein:

FIG. 7 shows non-uniformities in brightness and color, and color separation differing between Example 1 and Comparative Examples 4 and 5;

FIG. 8 is a sectional view showing a light emitting device of Example 2 made in accordance with principles of the presently disclosed subject matter;

FIG. 9 is a sectional view showing a light emitting device of Example 3 made in accordance with principles of the presently disclosed subject matter;

DESCRIPTION OF EXEMPLARY EMBODIMENTS

A description will now be made below to light emitting devices and methods according to the presently disclosed subject matter with reference to the accompanying drawings and in accordance with exemplary embodiments.

Figure 1:
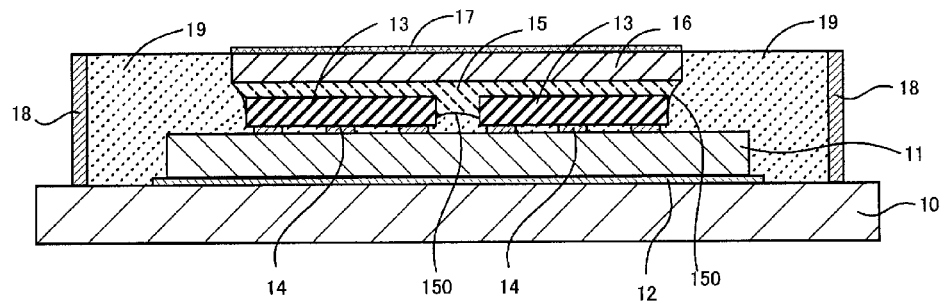
FIG. 1 is a sectional view showing a light emitting device of Example 1 made in accordance with principles of the presently discloses subject matter.

FIG. 1 is a sectional view showing a light emitting device of Example 1 made in accordance with principles of the presently discloses subject matter. In this light emitting device, a submount substrate 11 made of a material such as AN (aluminum nitride) ceramic can be disposed above a mounting substrate 10 through an adhesive 12. The submount substrate 11 can be smaller than the mounting substrate 10. An interconnect line can be formed on the upper surface of the submount substrate 11, and each of two flip-chip semiconductor light emitting elements (hereinafter simply called light emitting elements) 13 can be mounted onto the submount substrate 11 from above by bonding with a plurality of bumps 14. The two light emitting elements 13 can be composed of the same LEDs (light emitting diodes), and can be distanced a certain space from each other. A wavelength conversion layer 15 can be provided on the upper surfaces of the light emitting elements 13, and a light-transmitting plate member 16 can be provided on the wavelength conversion layer 15.

Phosphor particles (not shown in the drawings) can be dispersed in high concentration within a base material of the wavelength conversion layer 15. These phosphor particles may be YAG phosphor particles, for example, and can emit fluorescent light of a certain wavelength by being excited by light emitted from the light emitting elements 13. A material having transmittance to fluorescent light emitted from the phosphor particles as well as light emitted from the light emitting elements 13 can be used as the base material of the wavelength conversion layer 15. The base material may be a binder composed of an organic material such as a transparent resin, or an inorganic material such as glass. Examples of the applicable transparent resin include a silicone resin and an epoxy resin.

The wavelength conversion layer 15 can have slanting surfaces 150 connecting side surfaces of the light emitting elements 13 and the lower surface of the light-transmitting plate member 16. A slanting surface 150 can also be formed between the two light emitting elements 13 to connect respective side surfaces of the light emitting elements 13 directly. As shown in FIG. 1, these slanting surfaces 150 may be curved surfaces slightly depressed inwardly of the wavelength conversion layer 15.

The light-transmitting plate member 16 can be formed on the wavelength conversion layer 15 so as to cover the two light emitting elements 13. The upper surface of the light-transmitting plate member 16 can function as a light-extracting surface of this light emitting device. A material having transmittance to light emitted from the light emitting elements 13 and fluorescent light emitted from the phosphor particles can be used as a material of the light-transmitting plate member 16. Meanwhile, a light-transmitting plate having desired optical characteristics may be used as the light-transmitting plate member 16. As an example, the light-transmitting plate may be a plate filter to filter out a particular wavelength. The light-transmitting plate may also be a fluorescent glass plate containing a fluorescent component to convert light from the light emitting elements 13 to light with a desired wavelength, or a fluorescent ceramic plate (such as a YAG plate) formed by sintering a fluorescent raw material.

A light-transmitting scattering member 17 containing a scattering material (not shown in the drawings) can be disposed on the light-transmitting plate member 16. The light-transmitting scattering member 17 can be a plate member thinner than the light-transmitting plate member 16. A surface (light-exiting surface) of the light-transmitting scattering member 17 can be flattened to an extent that does not cause a reflective member 19 to rise up due to capillary action. The light-transmitting scattering member 17 will be described in detail later.

A frame 18 can be disposed on the mounting substrate 10 so as to surround a light emitting stacked body composed of the submount substrate 11, the light emitting elements 13, the bumps 14, the wavelength conversion layer 15, and the light-transmitting plate member 16. The frame 18 may be made of ceramic or a reflective resin, for example, and can have a height reaching the position of the upper surface of the light-transmitting plate member 16. The reflective member 19 can be disposed in a space defined between the frame 18 and the light emitting stacked body including the submount substrate 11. The reflective member 19 can also be formed in gaps between the submount substrate 11 and the light emitting elements 13 except the bumps 14. The position of a surface of the reflective member 19 may correspond to the position of an interface between the light-transmitting plate member 16 and the light-transmitting scattering member 17. The light-transmitting scattering member 17 may project from the surface (surface level) of the reflective member 19 so as not to be in contact with the reflective member 19.

The light-transmitting scattering member 17 can project from the surface of the reflective member 19 so as not to be in contact with the reflective member 19. Meanwhile, the reflective member 19 may be in contact with a side surface of the light-transmitting scattering member 17. Even if the reflective member 19 is in contact with the side surface of the light-transmitting scattering member 17, rising up of the reflective member 19 onto the upper surface of the light-transmitting scattering member 17 can still be prevented as the upper surface of the light-transmitting scattering member 17 is flattened to prevent generation of capillary action.

The reflective member 19 can contain a base member made of a silicone resin or a resin containing an inorganic binder, and a filler made of titanium oxide, zinc oxide, tantalum oxide, niobium oxide, zirconium oxide, aluminum oxide, or aluminum nitride, for example.

In an applicable method of manufacturing the aforementioned light emitting device, the light-transmitting scattering member 17 can be formed on the light-transmitting plate member 16 before formation of the aforementioned light emitting stacked body. Then, the light-transmitting plate member 16 and the light-transmitting scattering member 17 can be treated as one part, and disposed on the wavelength conversion layer 15.

In a different applicable method, the light-transmitting scattering member 17 may be disposed after the light-transmitting plate member 16 is disposed on the wavelength conversion layer 15 during formation of the light emitting stacked body.

A transparent material of the light-transmitting scattering member 17 can be disposed on the light-transmitting plate member 16 by a coating process such as printing, spraying and potting. The concentration of the scattering material to be mixed into the light-transmitting scattering member 17 can be controlled freely according to a desired degree of scattering. If the concentration of the scattering material is low, the light-transmitting scattering member 17 can be increased in thickness to achieve scattering effect.

In order to achieve uniform light scattering effect on the light-transmitting plate member 16, the scattering material should have a uniform concentration and the light-transmitting scattering member 17 should have a uniform thickness. In view of this, it is desirable that the scattering material be dispersed uniformly in the light-transmitting scattering member 17. The thickness of the light-transmitting plate member 16 can be 100 μm, for example, and that of the light-transmitting scattering member 17 can be some micrometers.

A filler is applicable as the scattering material in the light-transmitting scattering member 17, and examples of the filler may include titanium oxide, zinc oxide, niobium oxide, and zirconium oxide. Of the materials listed here, titanium oxide and zinc oxide are particularly effective as these materials achieve high scattering effect with a small amount while they can be supplied stably.

The aforementioned fillers are known to cause photocatalytic action by absorbing light emitted from the light emitting elements 13. Thus, the light-transmitting scattering member 17 can be disposed on the upper surface of the light-transmitting plate member 16 so as to be distanced from the wavelength conversion layer 15. If the light-transmitting scattering member 17 is disposed to be in contact with the wavelength conversion layer 15 (on the lower surface of the light-transmitting plate member 16), photocatalytic action of the filler can be accelerated by light and heat from the wavelength conversion layer 15. This can reduce the molecules of the resin (such as a silicone resin and an epoxy resin) as a base material of the wavelength conversion layer 15 to generate an oily substance, and this oily substance may bleed from the wavelength conversion layer 15. Bleeding of oil from the wavelength conversion layer 15 can be prevented by disposing the light-transmitting scattering member 17 on the upper surface of the light-transmitting plate member 16. As an example, an inorganic material such as glass or silicon oxide not decomposed by photocatalytic action can be used as a transparent material of the light-transmitting scattering member 17 and that of the light-transmitting plate member 16 disposed under the light-transmitting scattering member 17. Decomposition of the light-transmitting scattering member 17 or the light-transmitting plate member 16 by photocatalytic action may lead to a trouble such as a defective appearance of a semiconductor light emitting device and/or a failure to obtain desired light distribution. Additionally, as already described above, the light-transmitting scattering member 17 can project from the surface of the reflective member 19 so as not to be in contact with the reflective member 19. The reason therefor is to prevent influence of photocatalytic action on the reflective member 19 generated by the scattering material in the light-transmitting scattering member 17. Specifically, the reason is to prevent oil bleeding due to decomposition of the base resin (such as a silicone resin and an epoxy resin) of the reflective member 19 by photocatalytic action of the filler in the light-transmitting scattering member 17.

Further, the aforementioned flattening of the surface of the light-transmitting scattering member 17 is intended to prevent the constituent material of the reflective member 19 from rising up onto the light-transmitting scattering member 17. The surface of the light-transmitting scattering member 17 can be flattened at least in an outer peripheral region thereof, thereby preventing such rising up of the material while achieving scattering effect reaching as far as an edge part of the light-transmitting scattering member 17. This makes it possible to prevent non-uniformities in brightness and color.

Figure 2:
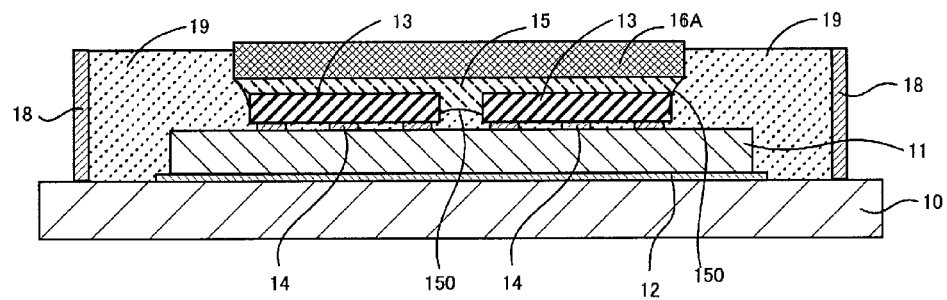
FIG. 2 is a sectional view showing a light emitting device of Comparative Example 1.
Figure 3:
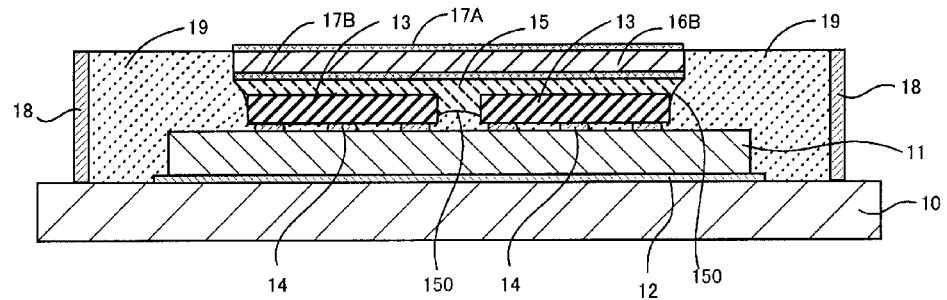
FIG. 3 is a sectional view showing a light emitting device of Comparative Example 2.
Figure 4:
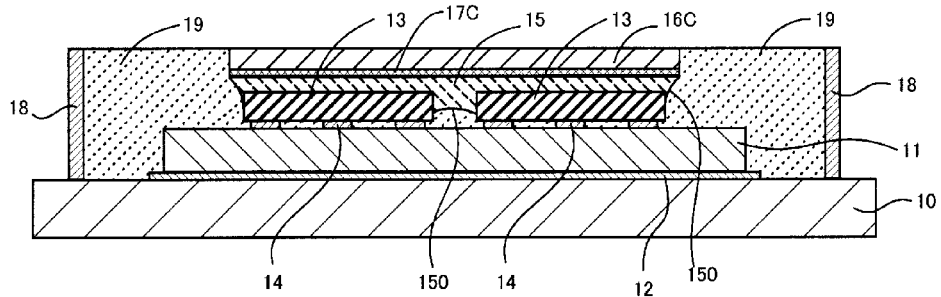
FIG. 4 is a sectional view showing a light emitting device of Comparative Example 3.

FIGS. 2 to 4 are sectional views showing Comparative Examples 1 to 3 of light emitting devices respectively in comparison with Example 1 according to the presently disclosed subject matter. In Comparative Examples 1 to 3 shown in FIGS. 2 to 4, components corresponding to those of Example 1 are denoted by the same reference numbers. In Comparative Example 1, a scattering material is dispersed entirely in a light-transmitting plate member 16A corresponding to the light-transmitting plate member 16 of Example 1. In Comparative Example 2, light-transmitting scattering members 17A and 17B containing a scattering material are disposed on the upper and lower surfaces of a light-transmitting plate member 16B corresponding to the light-transmitting plate member 16 of Example 1. In Comparative Example 3, a light-transmitting scattering member 17C containing a scattering material is disposed on the lower surface of a light-transmitting plate member 16C corresponding to the light-transmitting plate member 16 of Example 1. In each of Comparative Examples 1 to 3, the scattering material is in contact with the wavelength conversion layer 15 and the reflective member 19. When a resin material (organic material) such as a silicone resin and an epoxy resin is used as a base material of the wavelength conversion layer 15 and the reflective member 19 according to the presently discloses subject matter, oil bleeding is generated by photocatalytic effect if the light emitting elements 13 continues to be turned on for a long time. In particular, the wavelength conversion layer 15 is further susceptible to the effects of light or heat generated by a light source or phosphor particles, so that oil bleeding is likely to be generated from the wavelength conversion layer 15. Thus, unlike Comparative Examples 1 to 3, a light-transmitting scattering member can be disposed so as not to be in contact with the wavelength conversion layer 15. In addition, the light-transmitting scattering member can also be disposed so as not to be in contact with the reflective member 19.

In contrast to Comparative Examples 1 to 3, the light-transmitting scattering member 17 in Example 1 is configured so as not to be in contact with the wavelength conversion layer 15. To be specific, the light-transmitting scattering member 17 can be disposed on the upper surface of the light-transmitting plate member 16. Thus, the wavelength conversion layer 15 becomes less likely to be decomposed by photocatalytic action of the scattering material in the light-transmitting scattering member 17. In Example 1, the light-transmitting scattering member 17 is configured so as not to be in contact with the reflective member 19 either. To be specific, the reflective member 19 can be formed to a height where the reflective member 19 covers a side surface of the light-transmitting plate member 16, and is not formed to a height of the side surface of the light-transmitting scattering member 17 so that it does not cover the side surface of the light-transmitting scattering member 17. Thus, the reflective member 19 becomes less likely to be decomposed by photocatalytic action of the scattering material in the light-transmitting scattering member 17.

If the reflective member 19 is made of an inorganic material, the arrangement of the light-transmitting scattering member 17 is not limited to that as described above, as a reflective member or a wavelength conversion layer is not decomposed by photocatalytic action caused by a scattering material in an upper layer. If only the reflective member 19 is made of an inorganic material, the light-transmitting scattering member 17 may be in contact with the reflective member 19.

In the light emitting device of Example 1 of the aforementioned structure, light emitted upward from the light emitting elements 13 can enter the wavelength conversion layer 15. Then, part of the light can be converted by the phosphor particles to light with a certain wavelength, and the converted light can be mixed with light not having been converted by the phosphor particles. As a result, the mixture light can be emitted through the upper surface of the light-transmitting plate member 16 into the light-transmitting scattering member 17. Light emitted through the side surfaces of the light emitting elements 13 can enter the wavelength conversion layer 15. Then, part of the light can be converted by the phosphor particles to light with a certain wavelength, and the converted light can travel toward the slanting surfaces 150 of the wavelength conversion layer 15. Part of the light having traveled toward the slanting surfaces 150 can be reflected upward by the slanting surfaces 150 or the reflective member 19, and the resultant light can be emitted through the upper surface of the light-transmitting plate member 16 into the light-transmitting scattering member 17. The light having entered the light-transmitting scattering member 17 can travel in directions scattered by the scattering material in the light-transmitting scattering member 17. To be specific, the scattering material in the light-transmitting scattering member 17 can exert scattering effect on the light having entered the light-transmitting scattering member 17 from the light-transmitting plate member 16. In the light-transmitting scattering member 17, the scattered light can reach as far as a position above a peripheral part of the light-transmitting plate member 16, so that uniform brightness and color distributions can be obtained on the entire surface of the light-transmitting scattering member 17. As a result, non-uniformities in brightness and color, and color separation are corrected on the light-exiting surface of the light emitting device.

A method of manufacturing the light emitting device of Example 1 according to the presently disclosed subject matter will be described below.

First, element electrodes of the flip-chip light emitting elements 13 were mounted through the bumps 14 on an interconnect pattern formed on the upper surface of the mounting substrate 10 or the submount substrate 11. Phosphor particles and a spacer were added in predetermined concentrations to a silicone resin as an uncured base material of the wavelength conversion layer 15 and were mixed and kneaded well to be dispersed uniformly in the base material. Then, an uncured paste was obtained, and the paste was applied (or dropped) in a certain amount onto the upper surfaces of the light emitting elements 13 (first step).

The light-transmitting plate member 16 was prepared while the light-transmitting scattering member 17 containing a scattering material was formed on one surface of the light-transmitting plate member 16. More specifically, plate glass (light-transmitting plate member 16) was prepared while a glass layer (light-transmitting scattering member 17) containing titanium dioxide parties as a scattering material was formed on one surface of the light-transmitting plate member 16.

The light-transmitting plate member 16 slightly larger than the upper surfaces of the light emitting elements 13 was placed through the uncured paste above the light emitting elements 13 so as to place the light-transmitting scattering member 17 in an upper position, specifically to prevent contact of the light-transmitting scattering member 17 with the uncured paste (second step). Under the weights of the light-transmitting plate member 16 and the light-transmitting scattering member 17 themselves, or if necessary, by applying a load on the light-transmitting plate member 16 and the light-transmitting scattering member 17, a distance between the upper surfaces of the light emitting elements 13 and the light-transmitting plate member 16 was determined by the spacer. Next, the paste was cured by certain curing process to form the wavelength conversion layer 15 (third step). At this time, the paste kept its surface tension while covering at least parts of the side surfaces of the light emitting elements 13, thereby forming the slanting surfaces 150 connecting the side surfaces of the light emitting elements 13 and the lower surface of the light-transmitting plate member 16.

A ceramic ring configured to become the frame 18 was adhesively bonded with a silicone resin onto the mounting substrate 10 or the submount substrate 11 (fourth step). The frame 18 was disposed such that the position of the upper surface thereof substantially corresponds to the position of the upper surface of the light-transmitting plate member 16. A silicone resin (uncured) containing dispersed titanium dioxide particles as a scattering material was injected into the frame 18 as a precursor for a reflective member and then cured, thereby forming the reflective member 19 (fifth step). The reflective member 19 was formed so as to cover respective side surfaces of the light emitting elements 13, the wavelength conversion layer 15 and the light-transmitting plate member 16, while the side surface of the light-transmitting scattering member 17 was exposed without being covered with the reflective member 19.

According to the aforementioned manufacturing method, the reflective member 19 was formed so as to expose the side surface of the light-transmitting scattering member 17. Meanwhile, the reflective member 19 may be formed so as to cover the side surface of the light-transmitting scattering member 17. In this case, the reflective member 19 can be formed to cover the side surface of the light-transmitting scattering member 17 by controlling the height of the frame 18 or controlling the amount of the (uncured) resin containing the scattering material to become the precursor for the reflective member 19, for example. Further, the upper surface (surface not being in contact with the light-transmitting plate member 16) of the glass layer (light-transmitting scattering member 17) was formed so as to have flatness that does not allow the uncured resin containing the scattering material to rise up onto the upper surface due to capillary action. This prevents the uncured resin containing the scattering material from rising up onto the upper surface of the light-transmitting scattering member 17.

In the aforementioned manufacturing method, the uncured paste was applied onto the upper surfaces of the light emitting elements 13. However, the manufacturing method according to the presently disclosed subject matter is not limited thereto. As an example, the paste can be applied onto the lower surface of the light-transmitting plate member 16, or onto both the upper surfaces of the light emitting elements 13 and the lower surface of the light-transmitting plate member 16.

Figure 5:
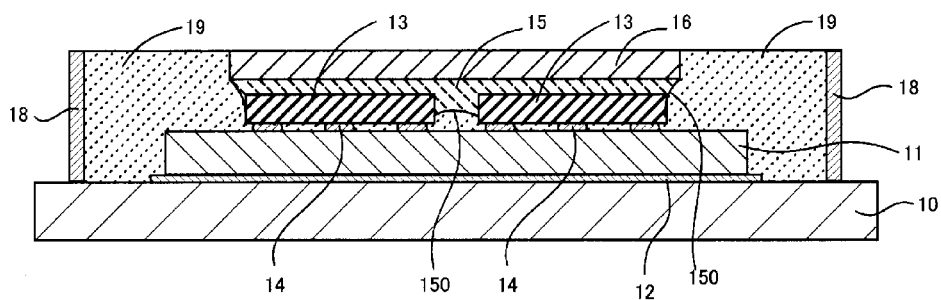
FIG. 5 is a sectional view showing a light emitting device of Comparative Example 4.
Figure 6:
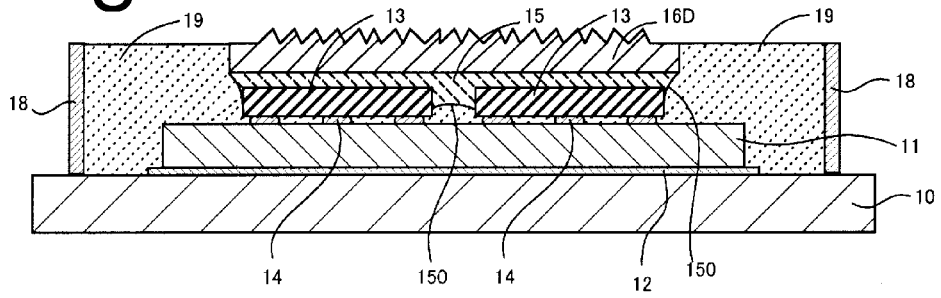
FIG. 6 is a sectional view showing a light emitting device of Comparative Example 5.

FIGS. 5 and 6 are sectional views showing Comparative Examples 4 and 5 of light emitting devices respectively in comparison with Example 1 according to the presently disclosed subject matter. In Comparative Examples 4 and 5 shown in FIGS. 5 and 6, components corresponding to those of Example 1 are denoted by the same reference numbers. In Comparative Example 4 of FIG. 5, the light-transmitting scattering member 17 of Example 1 is not provided. In Comparative Example 5 of FIG. 6, the light-transmitting scattering member 17 of Example 1 is not provided. Further, a light-transmitting plate member 16D corresponding to the light-transmitting plate member 16 of Example 1 has a flat edge region in a surface thereof, and a concave-convex region surrounded by the edge region.

Example 1 and Comparative Examples 4 and 5 were driven under the same driving condition, and results shown in FIG. 7 were obtained in terms of non-uniformities in brightness and color, and color separation. In FIG. 7, symbols A, B and C indicate that non-uniformities in brightness and color, and color separation were corrected in the order named (A indicates the most successful result, B indicates successful result but inferior to the result A, and C indicates unsuccessful result). The non-uniformities in brightness and color, and color separation were all corrected more successfully in Example 1 than in Comparative Examples 4 and 5.

Here, the non-uniformity in color is unevenness of color observed when the light-transmitting plate member 16 (including 16D) is viewed in a direction directly from above its surface, the non-uniformity in brightness is unevenness of brightness observed when the light-transmitting plate member 16 is viewed in the direction directly from above its surface, and the color separation is unevenness of color observed at various angles.

FIG. 8 is a sectional view showing a light emitting device of Example 2 made in accordance with the principles of the presently discloses subject matter. In the light emitting device of Example 2, a dome-shaped light-transmitting scattering member 27 is disposed on the light-transmitting plate member 16. Like the light-transmitting scattering member 17 of Example 1, the light-transmitting scattering member 27 can contain a scattering material. The light-transmitting scattering member 27 can be provided by applying an inorganic material containing a scattering material by potting onto the light-transmitting plate member 16, for example. The light-transmitting scattering member 27 can keep its shape as a dome with some curvature by the surface tension of the light-transmitting scattering member 27 itself.

The structure of the light emitting device of Example 2 can be the same in other respects as that of the light emitting device of Example 1. The scattering material also spreads through the entire light-transmitting scattering member 27 in Example 2. Thus, light from the light emitting elements 13 and light from the wavelength conversion layer 15 can be given scattering effect, so that non-uniformities in brightness and color, and color separation can be all corrected.

FIG. 9 is a sectional view showing a light emitting device of Example 3 made in accordance with the principles of the presently discloses subject matter. In the light emitting device of Example 3, a light-transmitting scattering member 37 can be disposed on the light-transmitting plate member 16, and the light-transmitting scattering member 37 can have a structure of a plurality of convex lenses 37a formed on a surface thereof. Like the light-transmitting scattering member 17 of Example 1, the light-transmitting scattering member 37 can contain a scattering material. The structure of the light emitting device of Example 3 is the same in other respects as that of the light emitting device of Example 1. In Example 3, not only the scattering material contained in the light-transmitting scattering member 37 but also the convex lenses 37a functioning as optical elements can achieve functions such as control of light distribution and enhancement of light extraction while providing scattering effect to light from the light emitting elements 13 and light from the wavelength conversion layer 15.

In order for a light-transmitting scattering member to achieve light scattering effect with a scattering material and to function as an optical element, an optical element such as a prism array may also be used instead of the lenses of Example 3.

In each of Examples described above, a plurality of light emitting elements is disposed in a light emitting device. However, the presently discloses subject matter is not limited thereto, but is also naturally applicable to a light emitting device with one light emitting element. Further, in each of the Examples described above, the reflective member 19 is disposed on the mounting substrate 10 so as to cover respective side surfaces of the submount substrate 11 and the aforementioned light emitting stacked body while filling in a gap therebetween. Meanwhile, in the light emitting device made in accordance with the principles of the presently discloses subject matter, a reflective member may be omitted, and a light emitting stacked body and a light-transmitting scattering member containing a scattering material may be disposed one above the other on a substrate.

Figure 10:
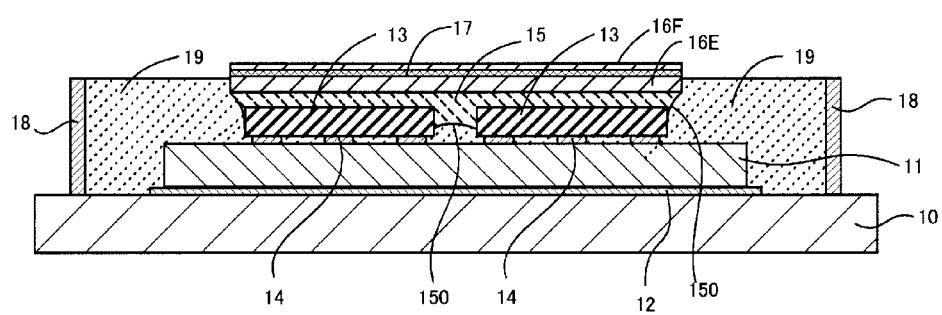
FIG. 10 is a sectional view showing a light emitting device of Example 4 made in accordance with principles of the presently disclosed subject matter.

Additionally, in the light emitting device made in accordance with principles of the presently discloses subject matter, the light-transmitting scattering member 17 containing a scattering material may be provided on a light-transmitting plate member 16E, and a light-transmitting plate member 16F may be provided further on the light-transmitting scattering member 17. This structure is shown as Example 4 in FIG. 10. To be specific, the light-transmitting scattering member 17 may be sandwiched between the light-transmitting plate members 16E and 16F to be formed integrally with the light-transmitting plate members 16E and 16F.

Figure 11:
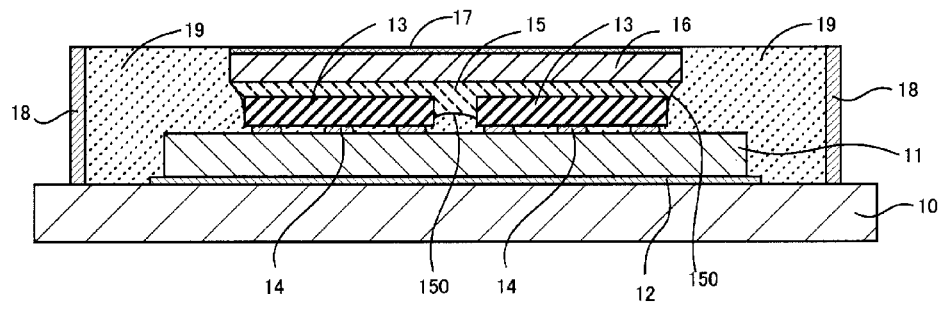
FIG. 11 is a sectional view showing a light emitting device of Example 5 made in accordance with principles of the presently disclosed subject matter.

Further, in Examples 1 to 4 described above, the light-transmitting scattering member 17 (including 27 and 37) projects from a surface of the reflective member 19. Meanwhile, the light-transmitting scattering member 17 may not project from the surface of the reflective member 19, specifically, a surface of the light-transmitting scattering member 17 may be exposed and in a position corresponding to the position of the surface of the reflective member 19. This structure is shown as Example 5 in FIG. 11. In this case, flatting the surface of the light-transmitting scattering member 17 as described above acts effectively, especially for prevention of the rising up of a material of the reflective member 19 onto the light-transmitting scattering member 17.

A light emitting element is certainly not limited to a flip-chip light emitting element, but a light emitting element connected to a pattern in a submount substrate by wire bonding is also applicable.

In each of the Examples described above, the light-transmitting plate member 16 and the light-transmitting scattering member 17 are disposed so as to form an interface therebetween. Meanwhile, the light-transmitting plate member 16 and the light-transmitting scattering member 17 may not form a definite interface but they may be formed integrally. To be specific, a scattering material may be unevenly distributed in a light-transmitting plate member to be distanced from a wavelength conversion layer (in this structure, a region where the scattering material is present becomes the light-transmitting scattering member 17).

The light emitting device made in accordance with principles of the presently discloses subject matter is applicable to vehicle-installed light sources such as headlights and light sources for general illumination purposes.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A light emitting device comprising:
   a substrate;
   a light emitting stacked body composed of a semiconductor light emitting element disposed on the substrate, a wavelength conversion layer disposed on top of the semiconductor light emitting element and containing phosphor particles, and a light-transmitting plate member disposed on top of and in contact with the wavelength conversion layer; and
   a light-transmitting scattering member composed of a scattering material and disposed on top of and in contact with the light-transmitting plate member.

2. The light emitting device according to claim 1, wherein
   the scattering material has a photocatalitic function,
   the wavelength conversion layer includes a base material composed of a resin, and
   the light transmitting plate member and the light-transmitting scattering member are composed of respective inorganic materials.

3. The light emitting device according to claim 2, wherein
   the base material of the wavelength conversion layer is a silicone resin,
   the light transmitting plate member is composed of glass, and the light-transmitting scattering member includes a base material composed of glass.

4. The light emitting device according to claim 3, comprising a reflective member configured to cover a side portion of the light emitting stacked body.

5. The light emitting device according to claim 4, wherein
   the reflective member includes a base material composed of a resin, and
   the light-transmitting scattering member is disposed to project from a surface level of the reflective member so as not to be in contact with the reflective member.

6. The light emitting device according to claim 2, comprising a reflective member configured to cover a side portion of the light emitting stacked body.

7. The light emitting device according to claim 6, wherein
   the reflective member includes a base material composed of a resin, and
   the light-transmitting scattering member is disposed to project from a surface level of the reflective member so as not to be in contact with the reflective member.

8. The light emitting device according to claim 1, wherein
   a base material of the wavelength conversion layer is a silicone resin,
   the light transmitting plate member is composed of glass, and
   the light-transmitting scattering member includes a base material composed of glass.

9. The light emitting device according to claim 8, comprising a reflective member configured to cover a side portion of the light emitting stacked body.

10. The light emitting device according to claim 9, wherein
    the reflective member includes a base material composed of a resin, and
    the light-transmitting scattering member is disposed to project from a surface level of the reflective member so as not to be in contact with the reflective member.

11. The light emitting device according to claim 1, comprising a reflective member configured to cover a side portion of the light emitting stacked body.

12. The light emitting device according to claim 4, wherein
    the reflective member includes a base material composed of a resin, and
    the light-transmitting scattering member is disposed to project from a surface level of the reflective member so as not to be in contact with the reflective member.

13. A method of manufacturing the light emitting device of claim 1, comprising:
    disposing an uncured resin containing phosphor particles dispersed therein on the semiconductor light emitting element placed on the substrate;
    placing the light-transmitting plate member above the light emitting element through the uncured resin, the light-transmitting plate member having an upper surface on which the light-transmitting scattering member is formed;
    curing the uncured resin to form the wavelength conversion layer between the light emitting element and the light-transmitting plate member;
    disposing a frame on the substrate so as to surround the light emitting element; and
    filling a space between the light emitting element and the frame with a reflective member, wherein
    the light-transmitting scattering member contains the scattering material, and has an upper surface given flatness to prevent the reflective member from rising up onto the upper surface due to capillary action.

14. The method of manufacturing a light emitting device according to claim 13, wherein the disposing an uncured resin, the placing the light-transmitting plate member, the curing the uncured resin, the disposing a frame on the substrate, and the filling a space between the light emitting element and the frame with a reflective member all occur in sequential order.

15. A light emitting device comprising:
   a substrate;
   a light emitting stacked body composed of a semiconductor light emitting element disposed on the substrate, a wavelength conversion layer disposed on the semiconductor light emitting element and containing phosphor particles, and a light-transmitting plate member disposed on the wavelength conversion layer; and
   a light-transmitting scattering member containing a scattering material and disposed on the light-transmitting plate member,
   wherein the scattering material has a photocatalitic function,
   the wavelength conversion layer includes a base material composed of a resin, and the light transmitting plate member and the light-transmitting scattering member are composed of respective inorganic materials.

16. The light emitting device according to claim 15, wherein the base material of the wavelength conversion layer is a silicone resin,
   the light transmitting plate member is composed of glass, and
   the light-transmitting scattering member includes a base material composed of glass.

17. The light emitting device according to claim 16, further comprising a reflective member configured to cover a side portion of the light emitting stacked body.

18. The light emitting device according to claim 17, wherein the reflective member includes a base material composed of a resin, and
   the light-transmitting scattering member is disposed to project from a surface level of the reflective member so as not to be in contact with the reflective member.

19. The light emitting device according to claim 15, further comprising a reflective member configured to cover a side portion of the light emitting stacked body.

20. The light emitting device according to claim 19, wherein the reflective member includes a base material composed of a resin, and
   the light-transmitting scattering member is disposed to project from a surface level of the reflective member so as not to be in contact with the reflective member.

21. A method of manufacturing the light emitting device of claim 15, comprising:
   disposing an uncured resin containing phosphor particles dispersed therein on the semiconductor light emitting element placed on the substrate;
   placing the light-transmitting plate member above the light emitting element through the uncured resin, the light-transmitting plate member having an upper surface on which the light- transmitting scattering member is formed;
   curing the uncured resin to form the wavelength conversion layer between the light emitting element and the light-transmitting plate member;
   disposing a frame on the substrate so as to surround the light emitting element; and
   filling a space between the light emitting element and the frame with a reflective member, wherein
   the light-transmitting scattering member contains the scattering material, and has an upper surface given flatness to prevent the reflective member from rising up onto the upper surface due to capillary action.

22. The method of manufacturing a light emitting device according to claim 21, wherein the disposing an uncured resin, the placing the light-transmitting plate member, the curing the uncured resin, the disposing a frame on the substrate, and the filling a space between the light emitting element and the frame with a reflective member all occur in sequential order.

* * * * *